United States Patent
Hwang

(10) Patent No.: US 11,671,725 B2
(45) Date of Patent: Jun. 6, 2023

(54) IMAGE SENSING DEVICE ADJUSTING COMPARISON PRECONDITION FOR PIXEL SIGNALS

(71) Applicant: SK hynix Inc., Gyeonggi-do (KR)

(72) Inventor: Won Seok Hwang, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/039,008

(22) Filed: Sep. 30, 2020

(65) Prior Publication Data

US 2021/0344857 A1 Nov. 4, 2021

(30) Foreign Application Priority Data

May 4, 2020 (KR) ........................ 10-2020-0053400

(51) Int. Cl.
*H04N 5/232* (2006.01)
*H04N 25/75* (2023.01)
*H04N 25/76* (2023.01)
*H04N 25/709* (2023.01)

(52) U.S. Cl.
CPC ........... *H04N 25/75* (2023.01); *H04N 25/709* (2023.01); *H04N 25/76* (2023.01)

(58) Field of Classification Search
None
See application file for complete search history.

(56) References Cited

U.S. PATENT DOCUMENTS

| 7,671,908 | B2* | 3/2010 | Lee | H04N 5/3575 348/241 |
| 2014/0124651 | A1* | 5/2014 | Nakahara | H04N 5/3577 327/307 |
| 2014/0211061 | A1* | 7/2014 | Nomiyama | H04N 5/378 348/312 |
| 2014/0239153 | A1* | 8/2014 | Gelfand | H04N 5/3575 250/208.1 |
| 2017/0111056 | A1* | 4/2017 | Tkachev | H04N 5/2253 |
| 2018/0063457 | A1* | 3/2018 | Shimamura | H04N 5/3698 |

(Continued)

FOREIGN PATENT DOCUMENTS

| KR | 10-2015-0096818 | 8/2015 |
| KR | 10-1934260 | 1/2019 |

*Primary Examiner* — Twyler L Haskins
*Assistant Examiner* — Wesley J Chiu
(74) *Attorney, Agent, or Firm* — IP & T Group LLP

(57) ABSTRACT

An image sensing device includes first and anterior comparators and first and second posterior comparators. The first anterior comparator generates a first anterior comparison signal based on a first pixel signal and a ramp signal. The first posterior comparator performs a first comparison that compares the first anterior comparison signal with a first reference signal under a first comparison precondition and generates a first posterior comparison signal corresponding to a result of the first comparison. The second anterior comparator generates a second anterior comparison signal based on a second pixel signal and the ramp signal. The second posterior comparator performs a second comparison that compares the second anterior comparison signal with a second reference signal under a second comparison precondition different from the first comparison precondition. The second posterior comparator generates a second posterior comparison signal corresponding to a result of the second comparison.

15 Claims, 15 Drawing Sheets

(56) References Cited

U.S. PATENT DOCUMENTS

2019/0058483 A1* 2/2019 Kim .................. H04N 5/378
2020/0053308 A1* 2/2020 Niwa ................. H03M 1/34
2022/0060647 A1* 2/2022 Lee .................. H04N 5/378

* cited by examiner

IMAGE SENSING DEVICE ADJUSTING COMPARISON PRECONDITION FOR PIXEL SIGNALS

CROSS-REFERENCE TO RELATED APPLICATION(S)

This application claims priority under 35 U.S.C. § 119 to Korean Patent Application No, 10-2020-0053400, filed on May 4, 2020, the disclosure of which is incorporated herein by reference in its entirety.

BACKGROUND

1. Field

One or more embodiments described herein relate to an image sensing device.

2. Description of the Related Art

An image sensing device may capture images based on semiconductor properties that react to light. Image sensing devices may be roughly classified as charge-coupled device (CCD) image sensing devices and complementary metal-oxide semiconductor (CMOS) image sensing devices. CMOS image sensing devices are widely used because they can allow both analog and digital control circuits to be directly implemented on a single integrated circuit (IC).

SUMMARY

Various embodiments of the present disclosure are directed to an image sensing device that minimizes an effect of a dropped source power.

In accordance with an embodiment, an image sensing device may include: a first anterior comparator suitable for generating a first anterior comparison signal based on a first pixel signal and a ramp signal; a first posterior comparator suitable for performing a first comparison that compares the first anterior comparison signal with a first reference signal under a first comparison precondition and generating a first posterior comparison signal corresponding to a result of the first comparison; a second anterior comparator suitable for generating a second anterior comparison signal based on a second pixel signal and the ramp signal; and a second posterior comparator suitable for performing a second comparison that compares the second anterior comparison signal with a second reference signal under a second comparison precondition different from the first comparison precondition, and suitable for generating a second posterior comparison signal corresponding to a result of the second comparison.

The first comparison precondition may include a condition for initializing an input terminal, to which the first anterior comparison signal is input, to a first voltage level, and the second comparison precondition may include a condition for initializing an input terminal, to which the second anterior comparison signal is input, to a second voltage level different from the first voltage level.

The first comparison precondition may include a condition for adjusting a voltage level of the first reference signal to a first voltage level, and the second comparison precondition may include a condition for adjusting a voltage level of the second reference signal to a second voltage level different from the first voltage level.

The first and second anterior comparators may operate under a same comparison precondition.

In accordance with an embodiment, an image sensing device may include: a first anterior comparator configured to be initialized during an initialization time and suitable for generating a first anterior comparison signal based on a first pixel signal and a ramp signal during a row time; a first posterior comparator suitable for initializing a first input terminal to a first voltage level and a first sub-input terminal to a default voltage level during the initialization time and generating a first posterior comparison signal based on the first anterior comparison signal input through the first input terminal and a first reference signal input through the first sub-input terminal during the row time; a second anterior comparator configured to be initialized during the initialization time and suitable for generating a second anterior comparison signal based on a second pixel signal and the ramp signal during the row time; and a second posterior comparator suitable for initializing a second input terminal to a second voltage level different from the first voltage level and a second sub-input terminal to the default voltage level during the initialization time, and generating a second posterior comparison signal based on the second anterior comparison signal input through the second input terminal and a second reference signal input through the second sub-input terminal during the row time.

The image sensing device may further include: a first sampling circuit coupled to the first posterior comparator and suitable for sampling the first reference signal; and a second sampling circuit coupled to the second posterior comparator, and suitable for sampling the second reference signal.

The first posterior comparator may generate and adjust the first reference signal through self-generation based on a first control code signal, and the second posterior comparator may generate and adjust the second reference signal through self-generation based on a second control code signal.

In accordance with an embodiment, an image sensing device may include: a first anterior comparator to be initialized during an initialization time and suitable for generating a first anterior comparison signal based on a first pixel signal and a ramp signal during a row time; a first posterior comparator suitable for adjusting a voltage level of a first reference signal to a first voltage level during the initialization time, and generating a first posterior comparison signal based on the first anterior comparison signal and the first reference signal during the row time; a second anterior comparator to be initialized during the initialization time, and suitable for generating a second anterior comparison signal based on a second pixel signal and the ramp signal during the row time; and a second posterior comparator suitable for adjusting a voltage level of a second reference signal to a second voltage level different to the first voltage level during the initialization time, and generating a second posterior comparison signal based on the second anterior comparison signal and the second reference signal during the row time.

The image sensing device may further include: a first sampling circuit coupled to the first posterior comparator and suitable for sampling the first reference signal; and a second sampling circuit coupled to the second posterior comparator, and suitable for sampling the second reference signal.

The first posterior comparator may generate and adjust the first reference signal through self-generation based on a first control code signal, and the second posterior comparator may generate and adjust the second reference signal through self-generation based on a second control code signal.

In accordance with an embodiment, a method for controlling an image sensing device may include: generating a first anterior comparison signal based on a first pixel signal and a ramp signal; performing a first comparison that compares the first anterior comparison signal with a first reference signal under a first comparison precondition, generating a first posterior comparison signal corresponding to a result of the first comparison; generating a second anterior comparison signal based on a second pixel signal and the ramp signal; performing a second comparison that compares the second anterior comparison signal with a second reference signal under a second comparison precondition different from the first comparison precondition; and generating a second posterior comparison signal corresponding to a result of the second comparison.

DETAILED DESCRIPTION

Various embodiments are described below with reference to the accompanying drawings, in order to describe in detail the present disclosure so that those with ordinary skill in art to which the present disclosure pertains may easily carry out the technical spirit of the present disclosure.

It will be understood that when an element is referred to as being "connected to" or "coupled to" another element, the element may be directly connected to or coupled to the another element, or electrically connected to or coupled to the another element with one or more elements interposed therebetween. In addition, it will also be understood that the terms "comprises," "comprising," "includes," and "including" when used in this specification, specify the presence of the stated elements and do not preclude the presence or addition of one or more other elements. In the description throughout the specification, some components are described in singular forms, but the present disclosure is not limited thereto, and it will be understood that the components may be formed in plural.

Figure 1:
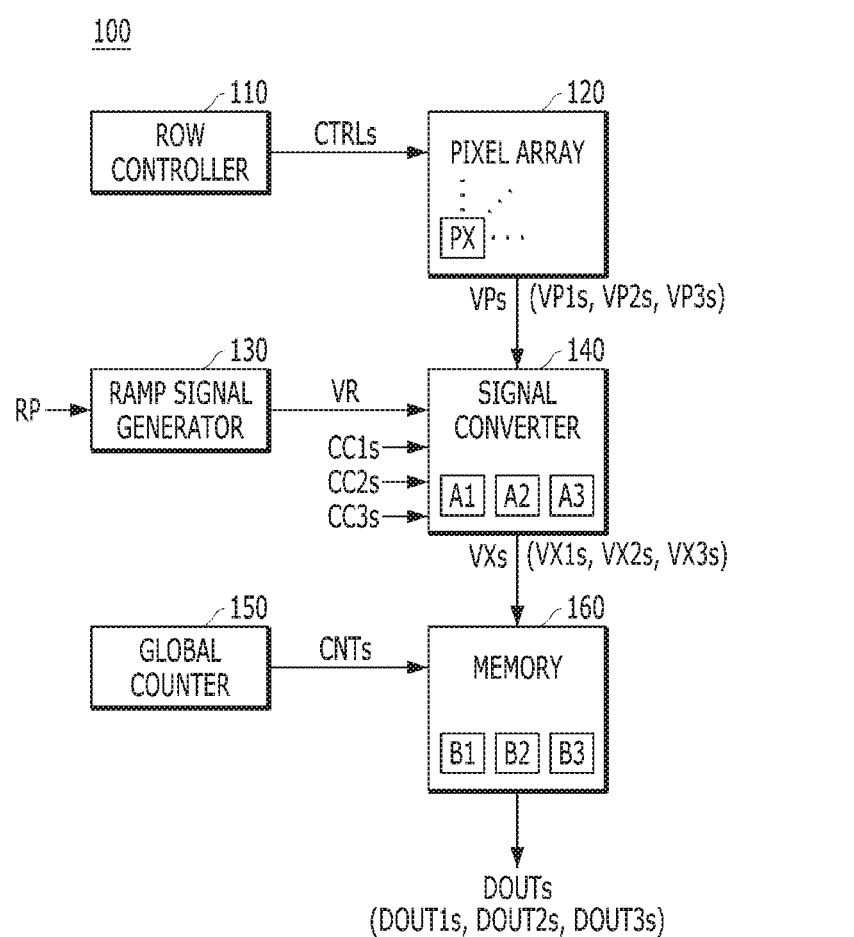
FIG. 1 illustrates an embodiment of an image sensing device.

FIG. 1 is a block diagram illustrating an image sensing device 100 in accordance with an embodiment.

Referring to FIG. 1, the image sensing device 100 may include a row controller 110, a pixel array 120, a ramp signal generator 130, a signal converter 140, a global counter 150 and a memory 160.

The row controller 110 may generate a plurality of row control signals CTRLs for controlling the pixel array 120 for each row. For example, the row controller 110 may generate first row control signals for controlling pixels arranged in a first row of the pixel array 120 during a first row time, and may generate second row control signals for controlling pixels arranged in a second row of the pixel array 120 during a second row time.

The pixel array 120 may include a plurality of pixels PXs arranged in rows and columns. The pixel array 120 may output a plurality of pixel signals VPs for each row to the signal converter 140 under the control of the row controller 110. For example, the pixel array 120 may generate the plurality of pixel signals VPs from the pixels arranged in the first row during the first row time, and may generate the plurality of pixel signals VPs from the pixels arranged in the second row during the second row time. The plurality of pixel signals VPs may be referred to as a plurality of first pixel signals VP1s, a plurality of second pixel signals VP2s and a plurality of third pixel signals VP3s. For convenience in description, the plurality of pixel signals VPs are described as being divided into three groups, but may be divided into a different number of groups in another embodiment.

The ramp signal generator 130 may generate a ramp signal VR having a set pattern for each row time based on a ramp control signal RP.

The signal converter 140 may generate a plurality of comparison signals VXs based on the plurality of first pixel signals VP1s, the plurality of second pixel signals VP2s, the plurality of third pixel signals VP3s, the ramp signal VR and first to third control code signals CC1s, CC2s and CC3s. The plurality of comparison signals VXs may be referred to as a plurality of posterior comparison signals VXs, or the plurality of comparison signals VXs may be referred to as a plurality of first posterior comparison signals VX1s, a plurality of second posterior comparison signals VX2s and a plurality of third posterior comparison signals VX3s.

For example, the signal converter 140 may include a first signal converter A1, a second signal converter A2 and a third signal converter A3. The first signal converter A1 may generate the plurality of first posterior comparison signals VX1s based on the plurality of first pixel signals VP1s, the ramp signal VR and the first control code signals CC1s. The second signal converter A2 may generate the plurality of second posterior comparison signals VX2s based on the plurality of second pixel signals VP2s, the ramp signal VR and the second control code signals CC2s. The third signal converter A3 may generate the plurality of third posterior comparison signals VX3s based on the plurality of third pixel signals VP3s, the ramp signal VR and the third control code signals CC3s.

The global counter 150 may generate one or more count signals CNTs for each row time.

The memory 160 may store the count signals CNTs for each column based on the plurality of first posterior comparison signals VX1s, the plurality of second posterior comparison signals VX2s and the plurality of third posterior comparison signals VX3s for each row time, and may generate a plurality of digital signals DOUTs for each row time. The plurality of digital signals DOUTs may be referred to as a plurality of first digital signals DOUT1s, a plurality of second digital signals DOUT2s and a plurality of third digital signals DOUT3s.

For example, the memory 160 may include a first memory B1, a second memory B2 and a third memory 63. The first memory 61 may store the count signals CNTs based on each of the plurality of first posterior comparison signals VX1s, and may output the stored count signals as the plurality of first digital signals DOUT1s. The second memory 62 may store the count signals CNTs based on each of the plurality of second posterior comparison signals VX2s, and may output the stored count signals as the plurality of second digital signals DOUT2s. The third memory 63 may store the count signals CNTs based on each of the plurality of third posterior comparison signals VX3s, and may output the stored count signals as the plurality of third digital signals DOUT3s.

Figure 2:
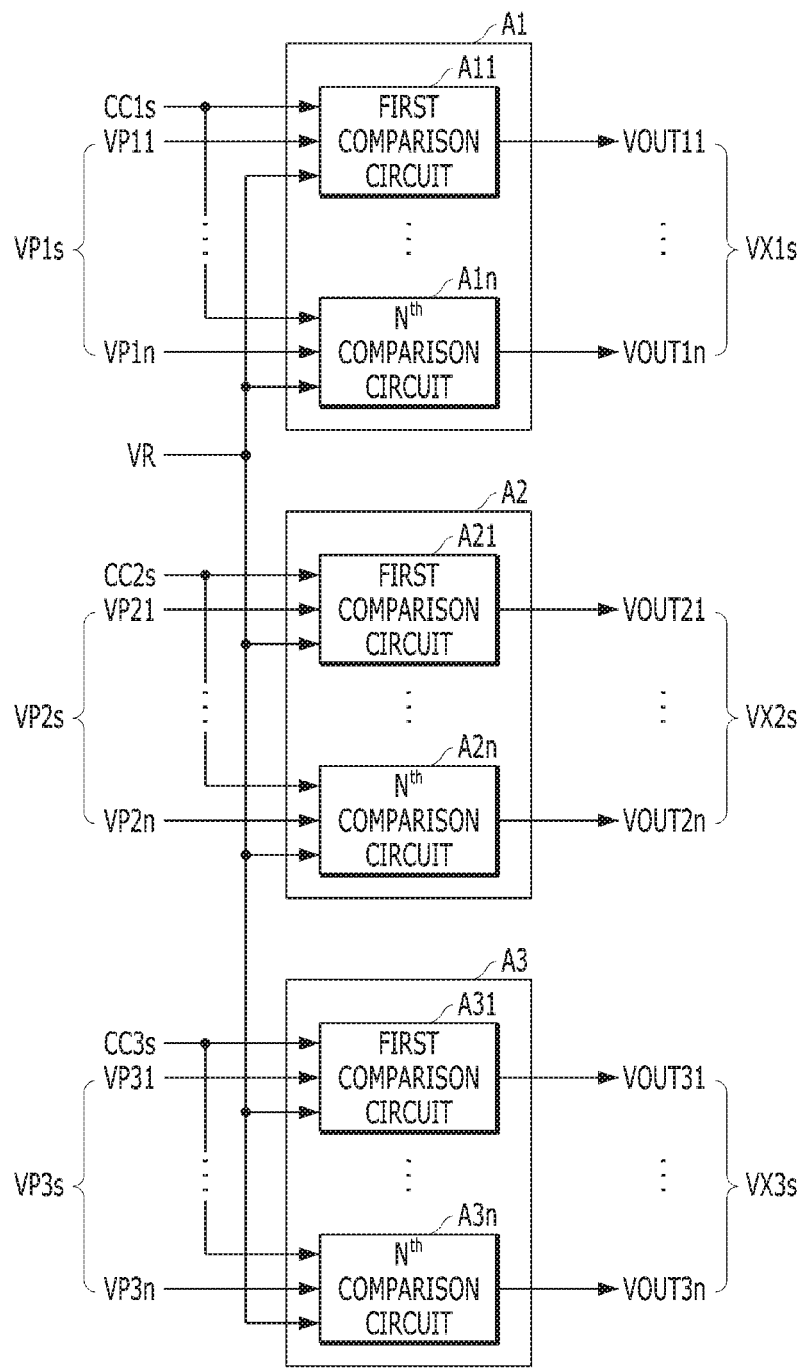
FIG. 2 illustrates an embodiment of a signal converter.

FIG. 2 is a block diagram illustrating an embodiment of the signal converter 140, which may include the first signal converter A1, the second signal converter A2 and the third signal converter A3.

The first signal converter A1 may generate the plurality of first posterior comparison signals VX1s based on the plurality of first pixel signals VP1s, the ramp signal VR and the first control code signals CC1s. For example, the first signal converter A1 may include a plurality of comparison circuits A11 to A1n. The plurality of comparison circuits A11 to A1n may receive the ramp signal VR and the first control code signals CC1s in common, may receive corresponding pixel signals among the plurality of first pixel signals VP1s, and may generate the plurality of first posterior comparison signals VX1s, respectively.

For example, the first comparison circuit A11 among the plurality of comparison circuits A11 to A1n may generate a first posterior comparison signal VOUT11 of the first posterior comparison signals VX1s based on a first pixel signal VP11 among the plurality of first pixel signals VP1s, the first control code signals CC1s and the ramp signal VR. The $n^{th}$ comparison circuit A1n, among the plurality of comparison circuits A11 to A1n, may generate an $n^{th}$ posterior comparison signal VOUT1n of the first posterior comparison signals VX1s based on an $n^{th}$ pixel signal VP1n among the plurality of first pixel signals VP1s, the first control code signals CC1s and the ramp signal VR.

The second signal converter A2 may generate the plurality of second posterior comparison signals VX2s based on the plurality of second pixel signals VP2s, the ramp signal VR and the second control code signals CC2s. For example, the second signal converter A2 may include a plurality of comparison circuits A21 to A2n. The plurality of comparison circuits A21 to A2n may receive the ramp signal VR and the second control code signals CC2s in common, may receive corresponding pixel signals among the plurality of second pixel signals VP2s, and may generate the plurality of second posterior comparison signals VX2s, respectively.

For example, the first comparison circuit A21 among the plurality of comparison circuits A21 to A2n may generate a first posterior comparison signal VOUT21 among the plurality of second posterior comparison signals VX2s based on a first pixel signal VP21 among the plurality of second pixel signals VP2s, the second control code signals CC2s and the ramp signal VR. The $n^{th}$ comparison circuit A2n, among the plurality of comparison circuits A21 to A2n, may generate an $n^{th}$ posterior comparison signal VOUT2n among the plurality of second posterior comparison signals VX2s based on an $n^{th}$ pixel signal VP2n among the plurality of second pixel signals VP2s, the second control code signals CC2s and the ramp signal VR.

The third signal converter A3 may generate the plurality of third posterior comparison signals VX3s based on the plurality of third pixel signals VP3s, the ramp signal VR and the third control code signals CC3s. For example, the third signal converter A3 may include a plurality of comparison circuits A31 to A3n. The plurality of comparison circuits A31 to A3n may receive the ramp signal VR and the third control code signals CC3s in common, may receive corresponding pixel signals among the plurality of third pixel signals VP3s, and may generate the plurality of third posterior comparison signals VX3s, respectively.

For example, the first comparison circuit A31 among the plurality of comparison circuits A31 to A3n, may generate a first posterior comparison signal VOUT31 among the plurality of third posterior comparison signals VX3s, based on a first pixel signal VP31 among the plurality of third pixel signals VP3s, the third control code signals CC3s and the ramp signal VR. The $n^{th}$ comparison circuit A3n among the plurality of comparison circuits A31 to A3n, may generate an $n^{th}$ posterior comparison signal VOUT3n among the plurality of third posterior comparison signals VX3s, based on an $n^{th}$ pixel signal VP3n among the plurality of third pixel signals VP3s, the third control code signals CC3s and the ramp signal VR.

The first comparison circuit A11 may be representative of the structure of comparison circuits A11 to Ain in the first signal converter A1, the first comparison circuit A21 may be representative of the structure of comparison circuits A21 to A2n in the second signal converter A2, and the first comparison circuit A31 may be representative of the structure of comparison circuits A31 to A3n in the third signal converter A3.

Figure 3:
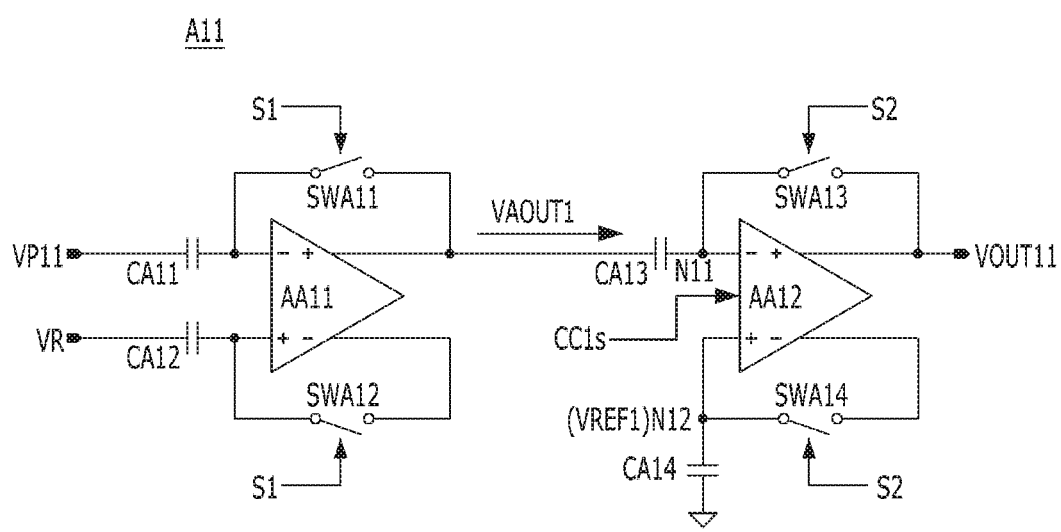
FIG. 3 illustrates an embodiment of a first comparison circuit in a first signal converter.

FIG. 3 is a block diagram illustrating an embodiment of the first comparison circuit A11 in the first signal converter A1. Referring to FIG. 3, the first comparison circuit A11 may include a first sampling circuit CA11, a second sampling circuit CA12, a first anterior comparator AA11, a first switch SWA11, a second switch SWA12, a third sampling circuit CA13, a fourth sampling circuit CA14, a first posterior comparator AA12, a third switch SWA13 and a fourth switch SWA14.

The first sampling circuit CA11 may sample the first pixel signal VP11 during the row time and output the sampled first pixel signal to a first input terminal of the first anterior comparator AA1.1. The first input terminal may be an inverted (−) input terminal.

The second sampling circuit CA12 may sample the ramp signal VR during the row time and output the sampled ramp signal to a second input terminal of the first anterior comparator AA11. The second input terminal may be a non-inverted (+) input terminal.

The first anterior comparator AA11 may generate a first anterior comparison signal VAOUT1 based on the sampled first pixel signal and the sampled ramp signal. For example, the first anterior comparator AA11 may compare the sampled first pixel signal with the sampled ramp signal during the row time, and may allow the first anterior comparison signal VAOUT1 to transition when the comparison result indicates that a voltage level of the sampled first pixel signal becomes lower than a voltage level of the sampled ramp signal. The first anterior comparator AA11 may be initialized by the first and second switches SWA11 and SWA12 during an initialization time before the row time.

The first switch SWA11 may be coupled between the first input terminal and a first output terminal of the first anterior comparator AA11. The first output terminal may be a non-inverted (+) output terminal and may be an output terminal through which the first anterior comparison signal VAOUT1 is output. The first switch SWA11 may selectively couple the first input terminal to the first output terminal based on a first switch control signal S1. For example, the first switch SWA11 may electrically couple the first input terminal to the first output terminal during the initialization time, and may electrically decouple the first input terminal from the first output terminal during the row time.

The second switch SWA12 may be coupled between the second input terminal and a second output terminal of the first anterior comparator AA11. The second output terminal may be an inverted (−) output terminal. The second switch SWA12 may selectively couple the second input terminal to the second output terminal based on the first switch control signal S1. For example, the second switch SWA12 may electrically couple the second input terminal to the second output terminal during the initialization time, and may electrically decouple the second input terminal from the second output terminal during the row time.

The third sampling circuit CA13 may sample the first anterior comparison signal VAOUT1 during the row time, and may output the sampled first anterior comparison signal to a first input terminal N11 of the first posterior comparator AA12. The first input terminal N11 may be an inverted (−) input terminal. The third sampling circuit CA13 may sample a voltage level of the first input terminal N11 of the first posterior comparator AA12 during the initialization time.

The fourth sampling circuit CA14 may sample a first reference signal VREF1 inputted (e.g., generated at) to a second input terminal N12 of the first posterior comparator AA12 during the initialization time. The second input terminal N1.2 may be a non-inverted (+) input terminal. The fourth sampling circuit CA14 may be coupled between the second input terminal N12 of the first posterior comparator AA1.2 and a low voltage terminal, for example, a ground voltage terminal.

The first posterior comparator AA12 may generate the first posterior comparison signal VOUT11 based on the sampled first anterior comparison signal and the first reference signal VREF1 during the row time. For example, the first posterior comparator AA12 may compare the sampled first anterior comparison signal with the first reference signal VREF1 under a first comparison precondition, and may allow the first posterior comparison signal VOUT11 to transition when the comparison result indicates that a voltage level of the sampled first anterior comparison signal becomes lower than a voltage level of the first reference signal VREF1.

For example, the first comparison precondition may include a condition in which the first input terminal N11 of the first posterior comparator AA12 is initialized to a first voltage level during the initialization time. In an embodiment, the first comparison precondition may include a condition in which the voltage level of the first reference signal VREF1 is adjusted to the first voltage level during the initialization time.

The first posterior comparator AA12 may be initialized during the initialization time, and when initialized the first posterior comparator AA12 may initialize the first input terminal N11 to the first voltage level or adjust the voltage level of the first reference signal VREF1 to the first voltage level, through self-generation based on the first control code signals CC1s. The self-generation is related to a current generated in the first posterior comparator AA12. Examples of the self-generation operation are described in more detail below, for example, with reference to FIG. 4.

The third switch SWA13 may be coupled between the first input terminal N11 and a first output terminal of the first posterior comparator AA12. The first output terminal may be a non-inverted (+) output terminal through which the first posterior comparison signal VOUT11 is output. The third switch SWA13 may selectively couple the first input terminal N11 to the first output terminal based on a second switch control signal S2. For example, the third switch SWA13 may electrically couple the first input terminal N11 to the first output terminal during the initialization time, and may electrically decouple the first input terminal N11 from the first output terminal during the row time.

The fourth switch SWA14 may be coupled between the second input terminal N1.2 and a second output terminal of the first posterior comparator AA12. The second output terminal may be an inverted (−) output terminal. The fourth switch SWA14 may selectively couple the second input terminal N12 to the second output terminal based on the second switch control signal S2. For example, the fourth switch SWA14 may electrically couple the second input terminal N12 to the second output terminal during the initialization time, and may electrically decouple the second input terminal N12 from the second output terminal during the row time.

Figure 4:
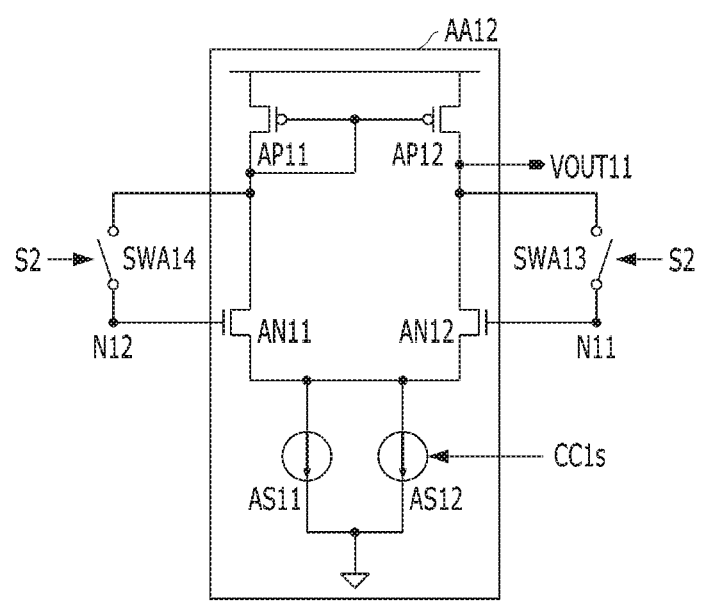
FIG. 4 illustrates an embodiment of a first posterior comparator.

FIG. 4 is a circuit diagram illustrating an embodiment of a first posterior comparator AA12, together with the third and fourth switches SWA13 and SWA14.

Referring to FIG. 4, the first posterior comparator AA12 may include input circuits AN11 and AN12, loading circuits AP11 and AP12, a first current source AS11 and a second current source AS12. The input circuits AN11 and AN12 may be coupled between the loading circuits AP11 and AP12 and the current sources AS11 and AS12, respectively. The input circuits AN11 and AN12 may receive the sampled first anterior comparison signal and the first reference signal VREF1. For example, the input circuits AN11 and AN12 may include a first NMOS transistor AN11 and a second NMOS transistor AN12, respectively. The first NMOS transistor AN11 may include a gate terminal coupled to the second input terminal N12 and a source terminal and a drain terminal coupled between the second output terminal and a first node. The second NMOS transistor AN12 may include a gate terminal coupled to the first input terminal N11 and a source terminal and a drain terminal coupled between the first output terminal and the first node.

The loading circuits AP11 and AP12 may be coupled between the respective input circuits AN11 and AN12 and a high voltage terminal, for example, a power voltage terminal. For example, the loading circuits AP11 and AP12 may include a first PMOS transistor AP1.1 and a second PMOS transistor AP12, respectively. The first PMOS transistor AP11 may include a gate terminal coupled to a first common coupling node and a source terminal and a drain terminal coupled between the high voltage terminal and the second output terminal. The first common coupling node and the second output terminal may be electrically coupled to each other. The second PMOS transistor AP12 may include a gate terminal coupled to the first common coupling node and a source terminal and a drain terminal coupled between the high voltage terminal and the first output terminal.

The first and second current sources AS11 and AS12 may be coupled in parallel between the first node and the low voltage terminal. The first current source AS11 may generate a first current corresponding to a default voltage level of the first reference signal VREF1. The second current source AS12 may generate a first adjusting current based on the first control code signals CC1s. The first adjusting current may be used to adjust the voltage level of the first reference signal VREF1.

The first posterior comparator AA12 having the above-described configuration may basically use the first current during the initialization time, and may selectively use the first adjusting current based on the first control code signals CC1s during the initialization time. Accordingly, a first reference current derived from the first current may be provided to the first input terminal N11 through the third switch SWA13 and to the second input terminal N12 through the fourth switch SWA14.

In one embodiment, the first reference current derived from a summed current of the first current and the first adjusting current (hereinafter referred to as a "first summed current") may be provided to the first input terminal N11 through the third switch SWA13 and to the second input terminal N12 through the fourth switch SWA14. For example, when the first summed current is generated during an initial period of the initialization time and the first current is generated during a last period of the initialization time, the first input terminal N11 may be initialized to the first voltage level during the initial period based on the first reference current derived from the first summed current. Also, the first reference signal VREF1 may have the default voltage level during the last period based on the first reference current derived from the first current. For example, the third sampling circuit CA13 may sample the first voltage level of the first input terminal N11 during the initial period, and the fourth sampling circuit CA14 may sample the default voltage level of the first reference signal VREF1 during the last period.

As another example, when the first current is generated during the initial period of the initialization time and the first summed current is generated during the last period of the initialization time, the first input terminal N11 may be initialized to the default voltage level during the initial period based on the first reference current derived from the first current. Also, the first reference signal VREF1 may have the first voltage level during the last period based on the first reference current derived from the first summed current. For instance, the third sampling circuit CA13 may sample the default voltage level of the first input terminal N11 during the initial period, and the fourth sampling circuit CA14 may sample the first voltage level of the first reference signal VREF1 during the last period. As such, the first reference signal VREF1 may not be provided from an external device or circuit, but may be generated (e.g., may be self-generated) based on the current generated in the first posterior comparator AA12.

Figure 5:
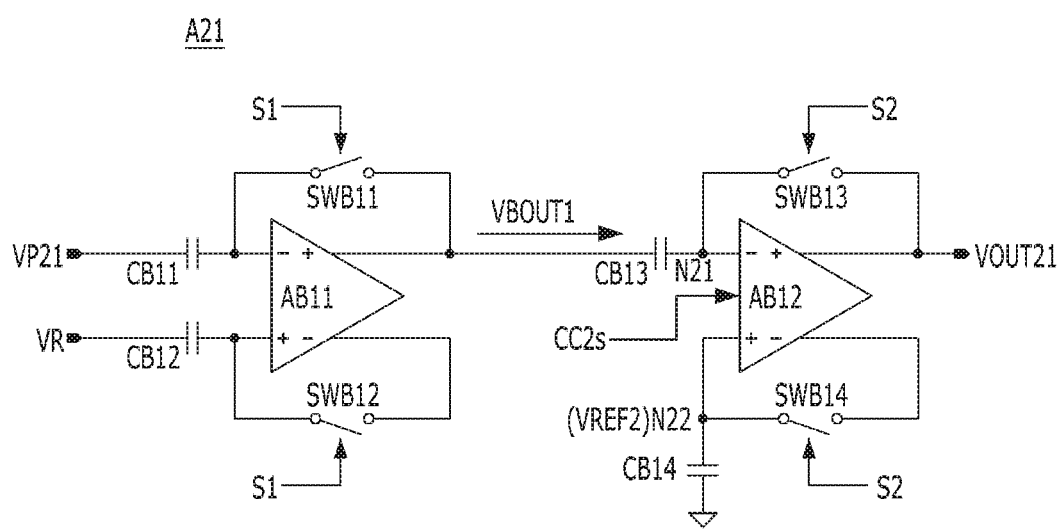
FIG. 5 illustrates an embodiment of a first comparison circuit in a second signal converter.

FIG. 5 is a block diagram illustrating an embodiment of the first comparison circuit A21 in the second signal converter A2. Referring to FIG. 5, the first comparison circuit A21 may include a first sampling circuit CB11, a second sampling circuit CB12, a first anterior comparator AB11, a first switch SWB11, a second switch SWB12, a third sampling circuit CB13, a fourth sampling circuit CB14, a first posterior comparator AB12, a third switch SWB13 and a fourth switch SWB14.

The first sampling circuit CB11 may sample the first pixel signal VP21 during the row time and may output the sampled first pixel signal to a first input terminal of the first anterior comparator AB11. The first input terminal may be an inverted (−) input terminal.

The second sampling circuit CB12 may sample the ramp signal VR during the row time and may output the sampled ramp signal to a second input terminal of the first anterior comparator AB11. The second input terminal may be a non-inverted (+) input terminal.

The first anterior comparator AB11 may generate a first anterior comparison signal VBOUT1 based on the sampled first pixel signal and the sampled ramp signal. For example, the first anterior comparator AB11 may compare the sampled first pixel signal with the sampled ramp signal during the row time, and may allow the first anterior comparison signal VBOUT1 to transition when the comparison result indicates that a voltage level of the sampled first pixel signal becomes lower than a voltage level of the sampled ramp signal. The first anterior comparator AB11 may be initialized by the first and second switches SWB11 and SWB12 during the initialization time before the row time. The first anterior comparator AB11 may be initialized according to the same comparison precondition as the first anterior comparator AA11 included in the first signal converter A1. For example, the input and output terminals of the first anterior comparators AA11 and AB1.1 may be initialized to the same level.

The first switch SWB11 may be coupled between the first input terminal and a first output terminal of the first anterior comparator AB11. The first output terminal may be a non-inverted (+) output terminal, and may be an output terminal through which the first anterior comparison signal VBOUT1 is output. The first switch SWB11 may selectively couple the first input terminal to the first output terminal based on the first switch control signal S1. For example, the first switch SWB11 may electrically couple the first input terminal to the first output terminal during the initialization time, and may electrically decouple the first input terminal from the first output terminal during the row time.

The second switch SWB12 may be coupled between the second input terminal and a second output terminal of the first anterior comparator AB11. The second output terminal may be an inverted (−) output terminal. The second switch SWB12 may selectively couple the second input terminal to the second output terminal based on the first switch control signal S1. For example, the second switch SWB12 may electrically couple the second input terminal to the second output terminal during the initialization time, and may electrically decouple the second input terminal from the second output terminal during the row time.

The third sampling circuit CB13 may sample the first anterior comparison signal VBOUT1 during the row time, and may output the sampled first anterior comparison signal to a first input terminal N21 of the first posterior comparator AB12. The first input terminal N21 may be an inverted (−) input terminal. The third sampling circuit CB13 may sample a voltage level of the first input terminal N21 of the first posterior comparator AB12 during the initialization time.

The fourth sampling circuit CB14 may sample a second reference signal VREF2 inputted (e.g., generated at) to a second input terminal N22 of the first posterior comparator AB12 during the initialization time. The second input terminal N22 may be a non-inverted (+) input terminal. The fourth sampling circuit CB14 may be coupled between the second input terminal N22 of the first posterior comparator AB12 and the low voltage terminal.

The first posterior comparator AB12 may generate the first posterior comparison signal VOUT21 based on the sampled first anterior comparison signal and the second reference signal VREF2 during the row time. For example, the first posterior comparator AB12 may compare the sampled first anterior comparison signal with the second reference signal VREF2 under a second comparison precondition different from the first comparison precondition, and may allow the first posterior comparison signal VOUT21 to transition when the comparison result indicates that a voltage level of the sampled first anterior comparison signal becomes lower than a voltage level of the second reference signal VREF2. For example, the second comparison precondition may include a condition in which the first input terminal N21 of the first posterior comparator AB12 is initialized to a second voltage level different from the first voltage level during the initialization time. In an embodiment, the second comparison precondition may include a condition in which the voltage level of the second reference signal VREF2 is adjusted to the second voltage level during the initialization time.

The first posterior comparator AB12 may be initialized during the initialization time, and when initialized the first posterior comparator AB12 may initialize the first input terminal N21 to the second voltage level or adjust the voltage level of the second reference signal VREF2 to the second voltage level, through self-generation based on the second control code signals CC2s. The self-generation operation may be related to current generated in the first posterior comparator AB12. An example of the self-generation operation will be described in more detail below, for example, with reference to FIG. 6.

The third switch SWB13 may be coupled between the first input terminal N21 and a first output terminal of the first posterior comparator AB12. The first output terminal may be a non-inverted (+) output terminal and may be an output terminal through which the first posterior comparison signal VOUT21 is output. The third switch SWB13 may selectively couple the first input terminal N21 to the first output terminal based on the second switch control signal S2. For example, the third switch SWB13 may electrically couple the first input terminal N21 to the first output terminal during the initialization time, and may electrically decouple the first input terminal N21 from the first output terminal during the row time.

The fourth switch SWB14 may be coupled between the second input terminal N22 and a second output terminal of the first posterior comparator AB12. The second output terminal may be an inverted (−) output terminal. The fourth switch SWB14 may selectively couple the second input terminal N22 to the second output terminal based on the second switch control signal S2. For example, the fourth switch SWB14 may electrically couple the second input terminal N22 to the second output terminal during the initialization time and may electrically decouple the second input terminal N22 from the second output terminal during the row time.

Figure 6:
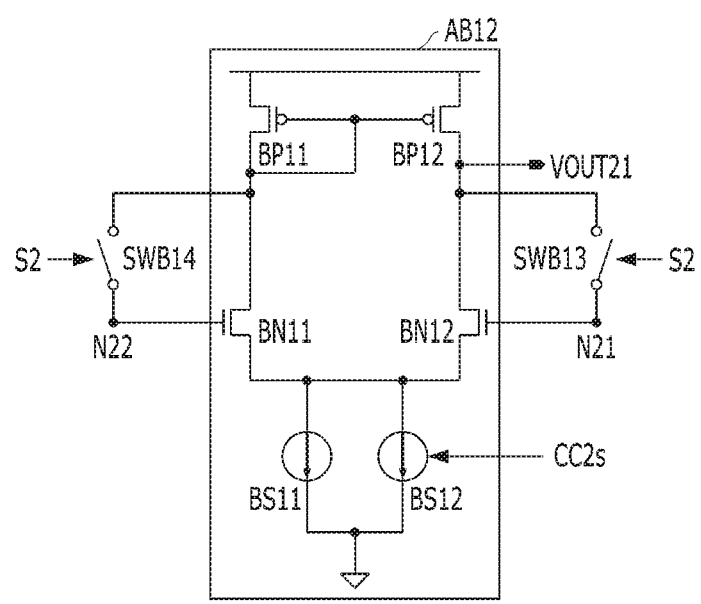
FIG. 6 illustrates an embodiment of a first posterior comparator.

FIG. 6 is a circuit diagram illustrating an embodiment of the first posterior comparator AB12, together with the third and fourth switches SWB13 and SWB14. Referring to FIG. 6, the first posterior comparator AB12 may include input circuits BN11 and BN12, loading circuits BP11 and BP12, a first current source B511 and a second current source 6512.

The input circuits BN11 and BN12 may be coupled between the loading circuits BP11 and BP12 and the current sources BS11 and BS12, respectively. The input circuits BN11 and BN12 may receive the sampled first anterior comparison signal and the second reference signal VREF2. For example, the input circuits BN11 and BN12 may include a first NMOS transistor BN11 and a second NMOS transistor BN12, respectively. The first NMOS transistor BN11 may include a gate terminal coupled to the second input terminal N22 and a source terminal and a drain terminal coupled between the second output terminal and a second node. The second NMOS transistor BN12 may include a gate terminal coupled to the first input terminal N21 and a source terminal and a drain terminal coupled between the first output terminal and the second node.

The loading circuits BP11 and BP12 may be coupled between the respective input circuits BN11 and BN12 and the high voltage terminal. For example, the loading circuits BP11 and BP12 may include a first PMOS transistor BP11 and a second PMOS transistor BP12, respectively. The first PMOS transistor BP11 may include a gate terminal coupled to a second common coupling node and a source terminal and a drain terminal coupled between the high voltage terminal and the second output terminal. The second common coupling node and the second output terminal may be electrically coupled to each other. The second PMOS transistor BP12 may include a gate terminal coupled to the second common coupling node and a source terminal and a drain terminal coupled between the high voltage terminal and the first output terminal.

The first and second current sources BS11 and BS12 may be coupled in parallel between the second node and the low voltage terminal. The first current source BS11 may generate a second current corresponding to a default voltage level of the second reference signal VREF2. The second current source BS12 may generate a second adjusting current based on the second control code signals CC2s. The second adjusting current may adjust the voltage level of the second reference signal VREF2.

The first posterior comparator AB12 having the above-described configuration may basically use the second current during the initialization time, and may selectively use the second adjusting current based on the second control code signals CC2s during the initialization time. Accordingly, a second reference current derived from the second current may be provided to the first input terminal N21 through the third switch SWB13 and to the second input terminal N22 through the fourth switch SWB14.

In an embodiment, the second reference current derived from a summed current of the second current and the second adjusting current (hereinafter referred to as a "second summed current") may be provided to the first input terminal N21 through the third switch SWB13 and to the second input terminal N22 through the fourth switch SWB14. For example, when the second summed current is generated during the initial period of the initialization time and the second current is generated during the last period of the initialization time, the first input terminal N21 may be initialized to the second voltage level during the initial period based on the second reference current derived from the second summed current. Also, the second reference signal VREF2 may have the default voltage level during the last period based on the second reference current derived from the second current.

For example, the third sampling circuit CB13 may sample the second voltage level of the first input terminal N21 during the initial period. The fourth sampling circuit CB14 may sample the default voltage level of the second reference signal VREF2 during the last period. As another example, when the second current is generated during the initial period of the initialization time and the second summed current is generated during the last period of the initialization time, the first input terminal N21 may be initialized to the default voltage level during the initial period based on the second reference current derived from the second current. The second reference signal VREF2 may have the second voltage level during the last period based on the second reference current derived from the second summed current.

For example, the third sampling circuit CB13 may sample the default voltage level of the first input terminal N21 during the initial period. The fourth sampling circuit CB14 may sample the second voltage level of the second reference signal VREF2 during the last period. As such, the second reference signal VREF2 may not be provided from an external device or circuit, but may be generated (e.g., self-generated) based on the current generated in the first posterior comparator AB12.

Figure 7:
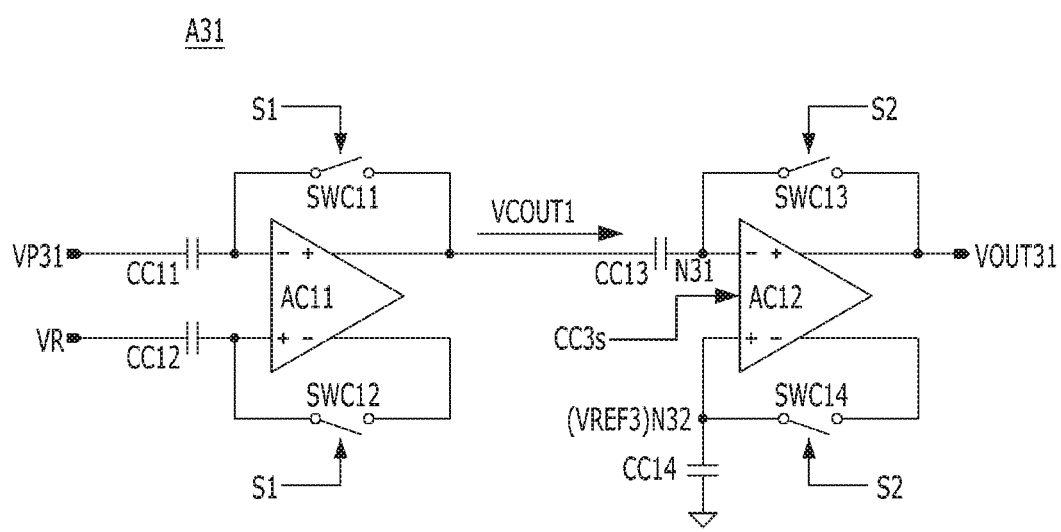
FIG. 7 illustrates an embodiment of a first comparison circuit in a third signal converter.

FIG. 7 is a block diagram illustrating an embodiment of the first comparison circuit A31 included in the third signal converter A3. Referring to FIG. 7, the first comparison circuit A31 may include a first sampling circuit CC11, a second sampling circuit CC12, a first anterior comparator AC11, a first switch SWC11, a second switch SWC12, a third sampling circuit CC13, a fourth sampling circuit CC14, a first posterior comparator AC12, a third switch SWC13 and a fourth switch SWC14.

The first sampling circuit CC11 may sample the first pixel signal VP31 during the row time and may output the sampled first pixel signal to a first input terminal of the first anterior comparator AC11. The first input terminal may be an inverted (−) input terminal.

The second sampling circuit CC12 may sample the ramp signal VR during the row time and may output the sampled ramp signal to a second input terminal of the first anterior comparator AC11. The second input terminal may be a non-inverted (+) input terminal.

The first anterior comparator AC11 may generate a first anterior comparison signal VCOUT1 based on the sampled first pixel signal and the sampled ramp signal. For example, the first anterior comparator AC11 may compare the sampled first pixel signal with the sampled ramp signal during the row time, and may allow the first anterior comparison signal VCOUT1 to transition when the comparison result indicates that a voltage level of the sampled first pixel signal becomes lower than a voltage level of the sampled ramp signal. The first anterior comparator AC11 may be initialized by the first and second switches SWC11 and SWC12 during an initialization time before the row time. The first anterior comparator AC11 may be initialized according to the same comparison precondition as the first anterior comparator AA11 in the first signal converter A1. For example, the input and output terminals of the first anterior comparators AA11, AB11 and AC11 may be initialized to the same level.

The first switch SWC11 may be coupled between the first input terminal and a first output terminal of the first anterior comparator AC11. The first output terminal may be a non-inverted (+) output terminal, and be an output terminal through which the first anterior comparison signal VCOUT1 is outputted. The first switch SWC11 may selectively couple the first input terminal to the first output terminal based on the first switch control signal S1. For example, the first switch SWC11 may electrically couple the first input terminal to the first output terminal during the initialization time, and may electrically decouple the first input terminal from the first output terminal during the row time.

The second switch SWC12 may be coupled between the second input terminal and a second output terminal of the first anterior comparator AC11. The second output terminal may be an inverted (−) output terminal. The second switch SWC12 may selectively couple the second input terminal to the second output terminal based on the first switch control signal S1. For example, the second switch SWC12 may electrically couple the second input terminal to the second output terminal during the initialization time, and may electrically decouple the second input terminal from the second output terminal during the row time.

The third sampling circuit CC13 may sample the first anterior comparison signal VCOUT1 during the row time and may output the sampled first anterior comparison signal to a first input terminal N31 of the first posterior comparator AC12. The first input terminal N31 may be an inverted (−) input terminal. The third sampling circuit CC13 may sample a voltage level of the first input terminal N31 of the first posterior comparator AC12 during the initialization time.

The fourth sampling circuit CC14 may sample a third reference signal VREF3 input (e.g., generated at) to a second input terminal N32 of the first posterior comparator AC12 during the initialization time. The second input terminal N32 may be a non-inverted (+) input terminal. The fourth sampling circuit CC14 may be coupled between the second input terminal N32 of the first posterior comparator AC12 and the low voltage terminal.

The first posterior comparator AC12 may generate the first posterior comparison signal VOUT31 based on the sampled first anterior comparison signal and the third reference signal VREF3 during the row time. For example, the first posterior comparator AC12 may compare the sampled first anterior comparison signal with the third reference signal VREF3 under a third comparison precondition different from the first and second comparison preconditions, and may allow the first posterior comparison signal VOUT31 to transition when the comparison result indicates that a voltage level of the sampled first anterior comparison signal becomes lower than a voltage level of the third reference signal VREF3. For example, the third comparison precondition may include a condition in which the first input terminal N31 of the first posterior comparator AC12 is initialized to a third voltage level different from the first and second voltage levels during the initialization time. In an embodiment, the third comparison precondition may include a condition in which the voltage level of the third reference signal VREF3 is adjusted to the third voltage level during the initialization time.

The first posterior comparator AC12 may be initialized during the initialization time, and when initialized the first posterior comparator AC12 may initialize the first input terminal N31 to the third voltage level or adjust the voltage level of the third reference signal VREF3 to the third voltage level, through self-generation, based on the third control code signals CC3s. The self-generation operation is related to a current generated in the first posterior comparator AC12. An example of the self-generation operation will be described in more detail below, for example, with reference to FIG. 8.

The third switch SWC13 may be coupled between the first input terminal N31 and a first output terminal of the first posterior comparator AC12. The first output terminal may be a non-inverted (+) output terminal and may be an output terminal through which the first posterior comparison signal VOUT31 is output. The third switch SWC13 may selectively couple the first input terminal N31 to the first output terminal based on the second switch control signal S2. For example, the third switch SWC13 may electrically couple the first input terminal N31 to the first output terminal during the initialization time, and may electrically decouple the first input terminal N31 from the first output terminal during the row time.

The fourth switch SWC14 may be coupled between the second input terminal N32 and a second output terminal of the first posterior comparator AC12. The second output terminal may be an inverted (−) output terminal. The fourth switch SWC14 may selectively couple the second input terminal N32 to the second output terminal based on the second switch control signal S2. For example, the fourth switch SWC14 may electrically couple the second input terminal N32 to the second output terminal during the initialization time, and may electrically decouple the second input terminal N32 from the second output terminal during the row time.

Figure 8:
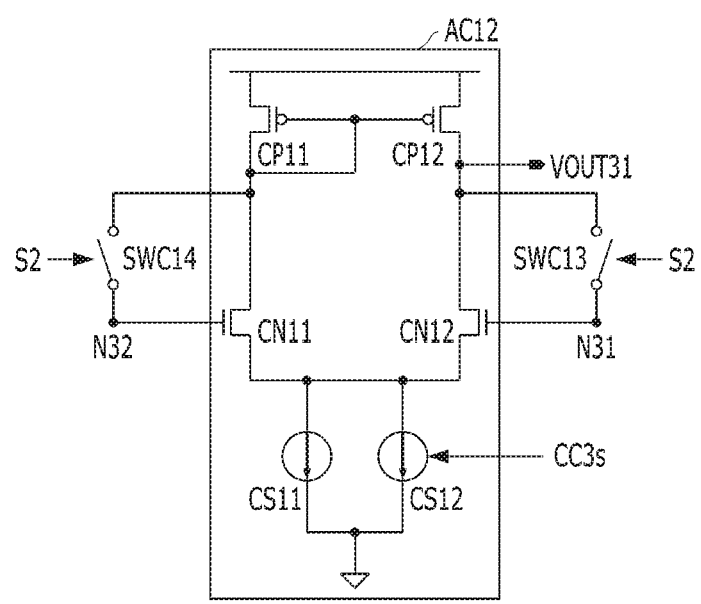
FIG. 8 illustrates an embodiment of a first posterior comparator.

FIG. 8 is a circuit diagram illustrating an embodiment of the first posterior comparator AC12 illustrated in FIG. 7, together with the third and fourth switches SWC13 and SWC1.4.

Referring to FIG. 8, the first posterior comparator AC12 may include input circuits CN11 and CN12, loading circuits CP11 and CP12, a first current source CS11 and a second current source CS12. The input circuits CN11 and CN12 may be coupled between the loading circuits CP11 and CP12 and the current sources CS11 and CS12, respectively. The input circuits CN11 and CN12 may receive the sampled first anterior comparison signal and the third reference signal VREF3. For example, the input circuits CN11 and CN12 may include a first NMOS transistor CN11 and a second NMOS transistor CN12, respectively. The first NMOS transistor CN11 may include a gate terminal coupled to the second input terminal N32 and a source terminal and a drain terminal coupled between the second output terminal and a third node. The second NMOS transistor CN12 may include a gate terminal coupled to the first input terminal N31 and a source terminal and a drain terminal coupled between the first output terminal and the third node.

The loading circuits CP11 and CP12 may be coupled between the respective input circuits CN11 and CN12 and the high voltage terminal. For example, the loading circuits CP11 and CP12 may include a first PMOS transistor CP11 and a second PMOS transistor CP12, respectively. The first PMOS transistor CP11 may include a gate terminal coupled to a third common coupling node and a source terminal and a drain terminal coupled between the high voltage terminal and the second output terminal. The third common coupling node and the second output terminal may be electrically coupled to each other. The second PMOS transistor CP12 may include a gate terminal coupled to the third common coupling node and a source terminal and a drain terminal coupled between the high voltage terminal and the first output terminal.

The first and second current sources CS11 and CS12 may be coupled in parallel between the third node and the low voltage terminal. The first current source CS11 may generate a third current corresponding to a default voltage level of the third reference signal VREF3. The second current source CS12 may generate a third adjusting current, for adjusting the voltage level of the third reference signal VREF3, based on the third control code signals CC3s.

The first posterior comparator AC12 having the above-described configuration may basically use the third current during the initialization time and may selectively use the third adjusting current based on the third control code signals CC3s during the initialization time. Accordingly, a third reference current derived from the third current may be provided to the first input terminal N31 through the third switch SWC13 and to the second input terminal N32 through the fourth switch SWC14.

In an embodiment, the third reference current derived from a summed current of the third current and the third adjusting current (hereinafter referred to as a "third summed current") may be provided to the first input terminal N31 through the third switch SWC13 and to the second input terminal N32 through the fourth switch SWC14. For example, when the third summed current is generated during the initial period of the initialization time and the third current is generated during the last period of the initialization time, the first input terminal N31 may be initialized to the third voltage level during the initial period based on the third reference current derived from the third summed current. The third reference signal VREF3 may have the default voltage level during the last period based on the third reference current derived from the third current. For example, the third sampling circuit CC13 may sample the third voltage level of the first input terminal N31 during the initial period. The fourth sampling circuit CC14 may sample the default voltage level of the third reference signal VREF3 during the last period.

As another example, when the third current is generated during the initial period of the initialization time and the third summed current is generated during the last period of the initialization time, the first input terminal N31 may be initialized to the default voltage level during the initial period based on the third reference current derived from the third current. The third reference signal VREF3 may have the third voltage level during the last period based on the third reference current derived from the third summed current. For example, the third sampling circuit CC13 may sample the default voltage level of the first input terminal N31 during the initial period, and the fourth sampling circuit CC14 may sample the third voltage level of the third reference signal VREF3 during the last period. As such, the third reference signal VREF3 may not be provided from an external device or circuit, but may be generated (e.g., self-generated) based on the current generated in the first posterior comparator AC12.

Figure 9:
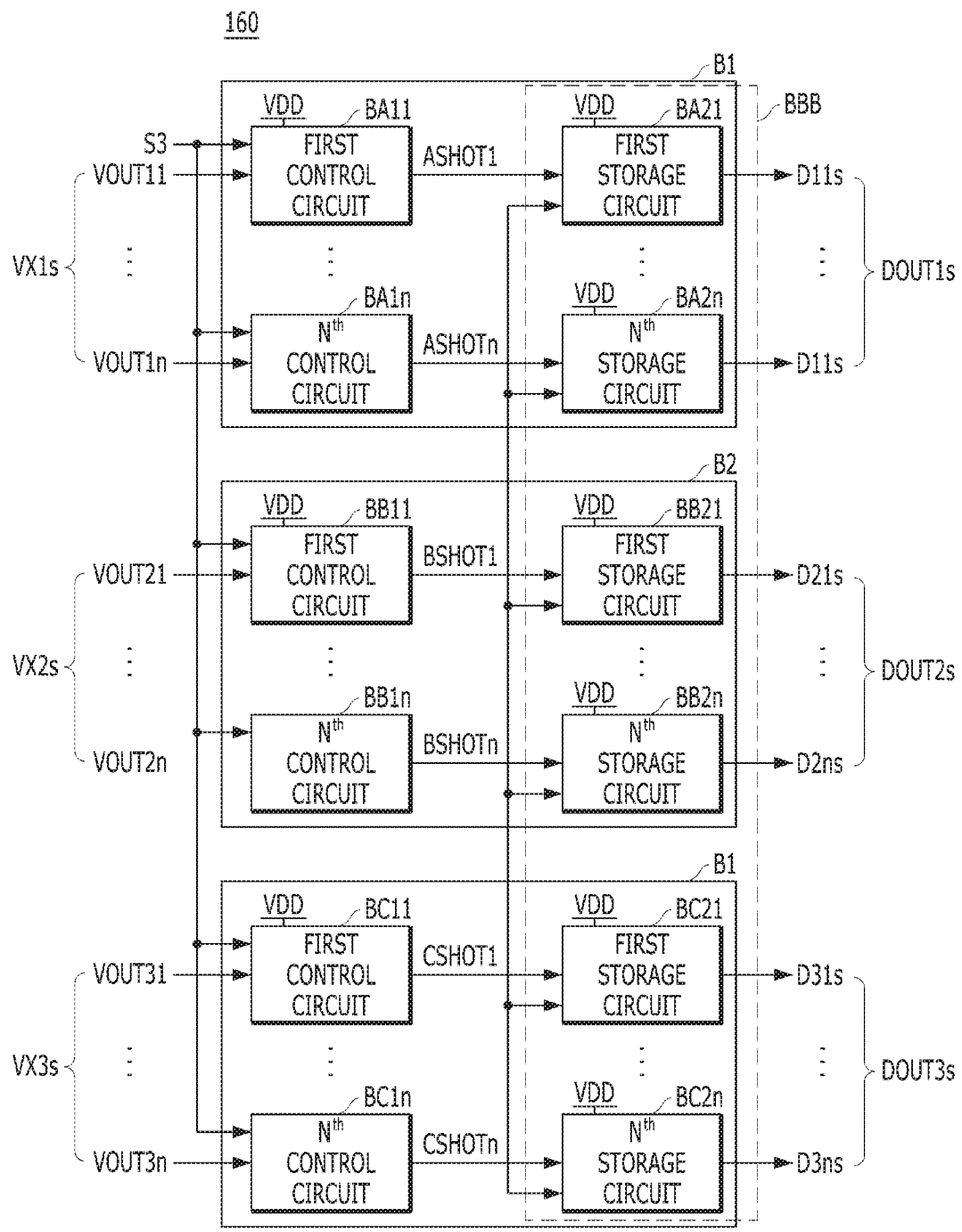
FIG. 9 illustrates an embodiment of a memory.

FIG. 9 is a block diagram illustrating an embodiment of the memory 160. Referring to FIG. 9, the memory 160 may include a first memory B1, a second memory B2 and a third memory B3.

As described above, the first memory 131 may store the count signals CNTs based on each of the plurality of first posterior comparison signals VX1s, and may output the stored count signals CNTs as the plurality of first digital signals DOUT1s. For example, the first memory B1 may include a plurality of first control circuits BA11 to BA1n and a plurality of first storage circuits BA21 to BA2n.

The plurality of first control circuits BA11 to BA1n may generate a plurality of first storage control signals ASHOT1 to ASHOTn, respectively, based on the plurality of first posterior comparison signals VX1s and an input control signal S3. For example, the first control circuit BA11 among the plurality of first control circuits BA11 to BA1n may generate the first storage control signal ASHOT1 among the plurality of first storage control signals ASHOT1 to ASHOTn based on the first posterior comparison signal VOUT11 of the first posterior comparison signals VX1s and the input control signal S3. The $n^{th}$ control circuit BA1n (among the plurality of first control circuits BA11 to BA1n) may generate the $n^{th}$ storage control signal ASHOTn (among the plurality of first storage control signals ASHOT1 to ASHOTn) based on the $n^{th}$ posterior comparison signal VOUT1n of the first posterior comparison signals VX1s and the input control signal S3.

The plurality of first storage circuits BA21 to BA2n may store the plurality of first digital signals DOUT1s based on the plurality of first storage control signals ASHOT1 to ASHOTn, respectively, and the count signals CNTs. For example, the first storage circuit BA21 (among the plurality of first storage circuits BA21 to BA2n) may store the count signals CNTs as first digital signal D11s of the first digital signals DOUT1s when the first storage control signal ASHOT1 (among the plurality of first storage control signals ASHOT1 to ASHOTn) is activated. The $n^{th}$ storage circuit BA2n (among the plurality of first storage circuits BA21 to BA2n) may store the count signals CNTs as $n^{th}$ digital signals D1ns of the first digital signals DOUT1s when the $n^{th}$ storage control signal ASHOTn (among the plurality of first storage control signals ASHOT1 to ASHOTn) is activated.

As described above, the second memory B2 may store the count signals CNTs based on each of the plurality of second posterior comparison signals VX2s, and may output the stored count signals CNTs as the plurality of second digital signals DOUT2s. For example, the second memory B2 may include a plurality of second control circuits BB11 to BB1n and a plurality of second storage circuits BB21 to BB2n.

The plurality of second control circuits BB11 to BB1n may generate a plurality of second storage control signals BSHOT1 to BSHOTn, respectively, based on the plurality of second posterior comparison signals VX2s and the input control signal S3. For example, the first control circuit BB11 (among the plurality of second control circuits BB11 to BB1n) may generate the first storage control signal BSHOT1 (among the plurality of second storage control signals BSHOT1 to BSHOTn) based on the first posterior comparison signal VOUT21 of the second posterior comparison signals VX2s and the input control signal S3. The $n^{th}$ control circuit BB1n (among the plurality of second control circuits BB11 to BB1n) may generate the $n^{th}$ storage control signal BSHOTn (among the plurality of second storage control signals BSHOT1 to BSHOTn) based on the $n^{th}$ posterior comparison signal VOUT2n of the second posterior comparison signals VX2s and the input control signal S3.

The plurality of second storage circuits BB21 to BB2n may store the plurality of second digital signals DOUT2s based on the plurality of second storage control signals BSHOT1 to BSHOTn, respectively, and the count signals CNTs. For example, the first storage circuit BB21 (among the plurality of second storage circuits BB21 to BB2n) may store the count signals CNTs as first digital signals D21s of the second digital signals DOUT2s when the first storage control signal BSHOT1 (among the plurality of second storage control signals BSHOT1 to BSHOTn) is activated. The $n^{th}$ storage circuit BB2n among the plurality of second storage circuits BB21 to BB2n may store the count signals CNTs as $n^{th}$ digital signals D2ns of the second digital signals DOUT2s when the $n^{th}$ storage control signal BSHOTn (among the plurality of second storage control signals BSHOT1 to BSHOTn) is activated.

As described above, the third memory B3 may store the count signals CNTs based on each of the plurality of third posterior comparison signals VX3s, and may output the stored count signals CNTs as the plurality of third digital signals DOUT3s. For example, the third memory B3 may include a plurality of third control circuits BC11 to BC1n and a plurality of third storage circuits BC21 to BC2n.

The plurality of third control circuits BC11 to BC1n may generate a plurality of third storage control signals CSHOT1 to CSHOTn, respectively, based on the plurality of third posterior comparison signals VX3s and the input control signal S3. For example, the first control circuit BC11 among the plurality of third control circuits BC11 to BC1n may generate the first storage control signal CSHOT1 (among the plurality of third storage control signals CSHOT1 to CSHOTn) based on the first posterior comparison signal VOUT31 of the third posterior comparison signals VX3s and the input control signal S3. The $n^{th}$ control circuit BC1n (among the plurality of third control circuits BC11 to BC1n) may generate the $n^{th}$ storage control signal CSHOTn (among the plurality of third storage control signals CSHOT1 to CSHOTn) based on the $n^{th}$ posterior comparison signal VOUT3n of the third posterior comparison signals VX3s and the input control signal S3.

The plurality of third storage circuits BC21 to BC2n may store the plurality of third digital signals DOUT3s based on the plurality of third storage control signals CSHOT1 to CSHOTn, respectively, and the count signals CNTs. For example, the first storage circuit BC21 (among the plurality of third storage circuits BC21 to BC2n) may store the count signals CNTs as first digital signal D31s of the third digital signals DOUT3s when the first storage control signal CSHOT1 (among the plurality of third storage control signals CSHOT1 to CSHOTn) is activated. The $n^{th}$ storage circuit BC2n (among the plurality of third storage circuits BC21 to BC2n) may store the count signals CNTs as $n^{th}$ digital signals D3ns of the third digital signals DOUT3s when the $n^{th}$ storage control signal CSHOTn (among the plurality of third storage control signals CSHOT1 to CSHOTn) is activated.

The plurality of first control circuits BA11 to BA1n, the plurality of second control circuits BB11 to BB1n, the plurality of third control circuits BC11 to BC1n, the plurality of first storage circuits BA21 to BA2n, the plurality of second storage circuits BB21 to BB2n and the plurality of third storage circuits BC21 to BC2n may use the same voltage, for example, a power supply voltage VDD, as a source power supply. The plurality of first storage circuits BA21 to BA2n, the plurality of second storage circuits BB21 to BB2n and the plurality of third storage circuits BC21 to BC2n may be referred to as "line memories".

Figure 10:
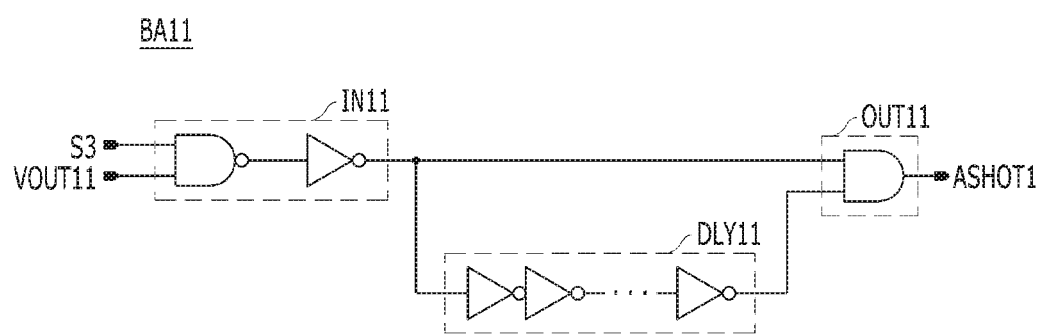
FIG. 10 illustrates an embodiment of a first control circuit of a first group.

FIG. 10 is a circuit diagram illustrating an embodiment of the first control circuit BA11 among the first control circuits BA11 to BA1n illustrated in FIG. 9. Since the first control circuits BA11 to BA1n may be designed to be all the same, the first control circuit BA11 is representatively described hereinafter.

Referring to FIG. 10, the first control circuit BA11 may include an input circuit IN11, a delay circuit DLY11 and an output circuit OUT11. The input circuit IN11 may receive the first posterior comparison signal VOUT11 of the plurality of first posterior comparison signals VX1s and the input control signal S3. For example, the input circuit IN11 may include a NAND gate and a NOT gate. The NAND gate may perform a NAND operation on the first posterior comparison signal VOUT11 and the input control signal S3, and the NOT gate may invert an output signal of the NAND gate.

The delay circuit DLY11 may delay an output signal of the input circuit IN11 by a set delay time. For example, the delay circuit DLY11 may include an inverter chain in which a plurality of NOT gates are coupled in series to one another.

The output circuit OUT11 may receive the output signal of the input circuit IN11 and an output signal of the delay circuit DLY11, and may generate the first storage control signal ASHOT1 among the plurality of first storage control signals ASHOT1 to ASHOTn. For example, the output circuit OUT11 may include an OR gate. The OR gate may perform an OR operation on the output signal of the input circuit IN11 and the output signal of the delay circuit DLY11, thereby generating the first storage control signal ASHOT1 that is generated for a set (e.g., relatively short) time. The pulse width (e.g., activation width) of the first storage control signal ASHOT1 may correspond to the delay time.

Figure 11:
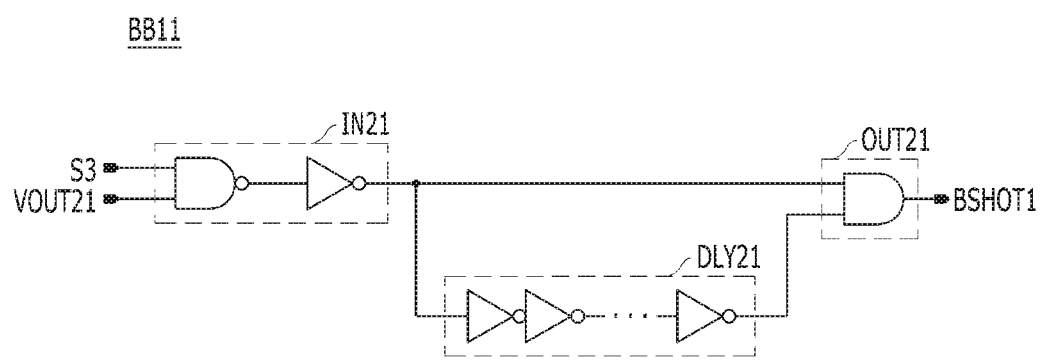
FIG. 11 illustrates an embodiment of a first control circuit of a second group.

FIG. 11 is a circuit diagram illustrating an embodiment of the first control circuit BB11 among the second control circuits BB11 to BB1n illustrated in FIG. 9. Since the second control circuits BB11 to BB1n may be designed to be all the same, the first control circuit BB11 is representatively described hereinafter.

Referring to FIG. 11, the first control circuit BB11 may include an input circuit IN21, a delay circuit DLY21 and an output circuit OUT21. The input circuit IN21 may receive the first posterior comparison signal VOUT21 of the plurality of second posterior comparison signals VX2s and the input control signal S3. For example, the input circuit IN21 may include a NAND gate and a NOT gate. The NAND gate may perform a NAND operation on the first posterior comparison signal VOUT21 and the input control signal S3, and the NOT gate may invert an output signal of the NAND gate.

The delay circuit DLY21 may delay an output signal of the input circuit IN21 by the delay time. For example, the delay circuit DLY21 may include an inverter chain in which a plurality of NOT gates are coupled in series to one another.

The output circuit OUT21 may receive the output signal of the input circuit IN21 and an output signal of the delay circuit DLY21, and may generate the first storage control signal BSHOT1 among the plurality of second storage control signals BSHOT1 to BSHOTn. For example, the output circuit OUT21 may include an OR gate. The OR gate may perform an OR operation on the output signal of the input circuit IN21 and the output signal of the delay circuit DLY21, thereby generating the first storage control signal BSHOT1 that is generated for a set (e.g., relatively short) time. The pulse width (e.g., activation width) of the first storage control signal BSHOT1 may correspond to the delay time.

Figure 12:
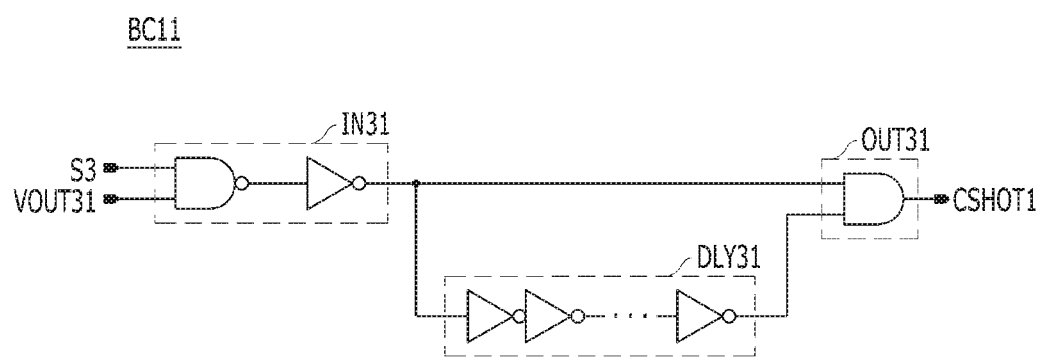
FIG. 12 illustrates an embodiment of a first control circuit of a third group.

FIG. 12 is a circuit diagram illustrating an embodiment of the first control circuit BC11 among the third control circuits BC11 to BC1n illustrated in FIG. 9. Since the third control circuits BC11 to BC1n may be designed to be all the same, the first control circuit BC11 is representatively described hereinafter.

Referring to FIG. 12, the first control circuit BC11 may include an input circuit IN31, a delay circuit DLY31 and an output circuit OUT31. The input circuit IN31 may receive the first posterior comparison signal VOUT31 of the plurality of third posterior comparison signals VX3s and the input control signal S3. For example, the input circuit IN31 may include a NAND gate and a NOT gate. The NAND gate may perform a NAND operation on the first posterior comparison signal VOUT31 and the input control signal S3, and the NOT gate may invert an output signal of the NAND gate.

The delay circuit DLY31 may delay an output signal of the input circuit IN31 by the delay time. For example, the delay circuit DLY31 may include an inverter chain in which a plurality of NOT gates are coupled in series to one another.

The output circuit OUT31 may receive the output signal of the input circuit IN31 and an output signal of the delay circuit DLY31, and may generate the first storage control signal CSHOT1 among the plurality of third storage control signals CSHOT1 to CSHOTn. For example, the output circuit OUT31 may include an OR gate. The OR gate may perform an OR operation on the output signal of the input circuit IN31 and the output signal of the delay circuit DLY31, thereby generating the first storage control signal CSHOT1 that is generated for a set (e.g., relatively short) time. The pulse width (e.g., activation width) of the first storage control signal CSHOT1 may correspond to the delay time.

Figure 13:
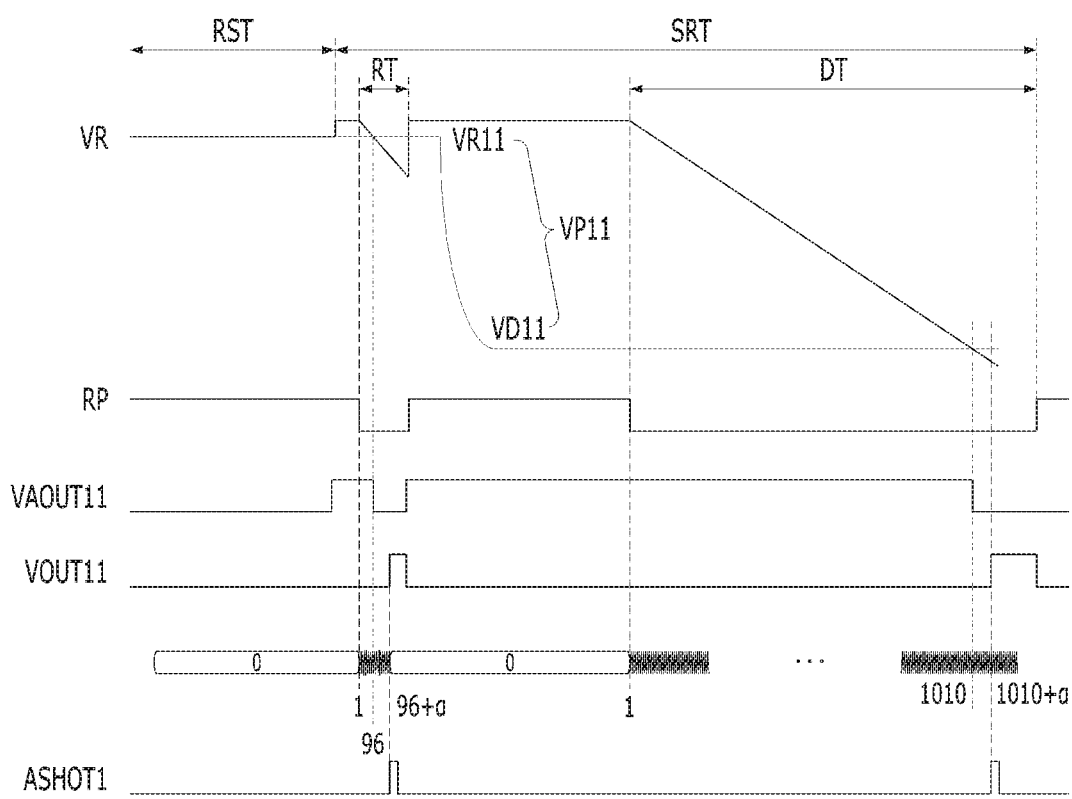
FIG. 13 illustrates an embodiment of a timing diagram for an image sensing device.

FIG. 13 illustrates an embodiment of a timing diagram for operating the image sensing device 100. FIG. 13 illustrates an operation relating to one pixel signal (e.g., the first pixel signal VP11) as a representative example.

Figure 14:
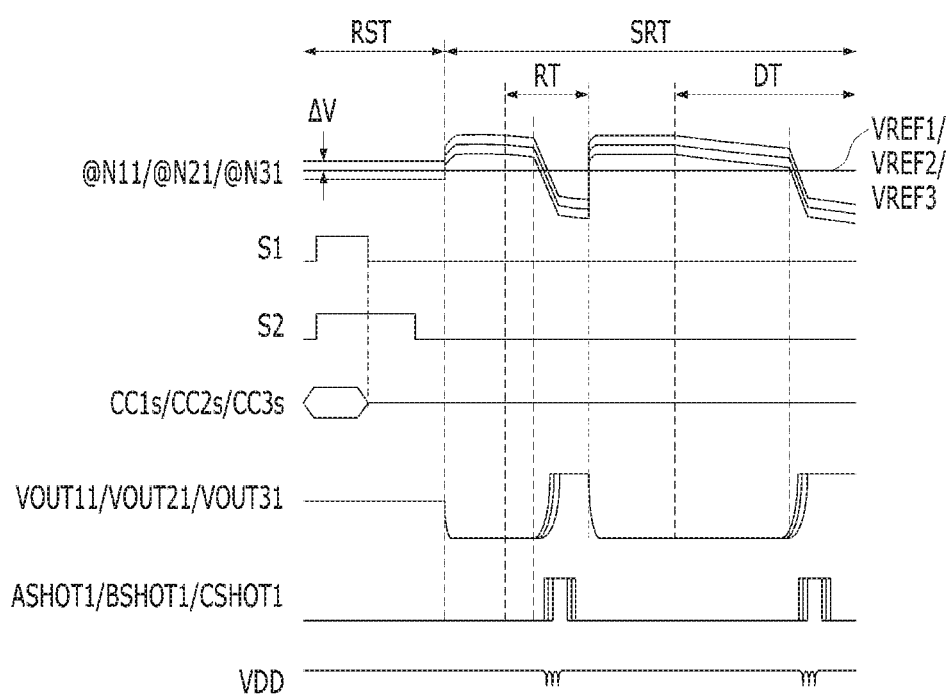
FIGS. 14 and 15 illustrate additional timing diagrams for an image sensing device.
Figure 15:
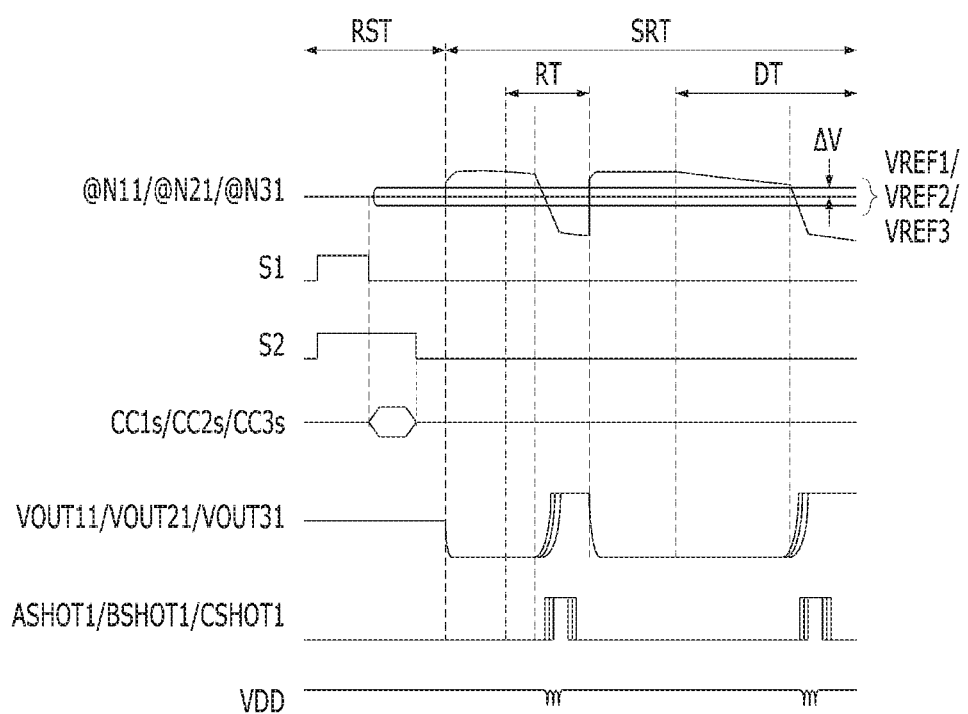

Referring to FIG. 13, the image sensing device 100 may be initialized during an initialization time RST, For example, the plurality of posterior comparators in the first signal converter A1 may be initialized according to the first comparison precondition, the plurality of posterior comparators included in the second signal converter A2 may be initialized according to the second comparison precondition, and the plurality of posterior comparators included in the third signal converter A3 may be initialized according to the third comparison precondition (e.g., refer to FIGS. 14 and 15).

The image sensing device 100 may generate and store the first pixel signal VP11 during a row time SRT. More detailed descriptions thereof are as follows.

The pixel array 120 may generate the first pixel signal VP1.1 during the row time SRT. For example, the pixel array 120 may generate a reset signal VR11, which corresponds to components of noise in the first pixel signal VP11, as the first pixel signal VP11 during a reset time RT of the row time SRT. The pixel array may then generate a data signal VD11, which corresponds to incident light, as the first pixel signal VP11 during a data time DT of the row time SRT.

The ramp signal generator 130 may generate the ramp signal VR having a set pattern during the row time SRT based on a ramp control signal RP. For example, the ramp signal generator 130 may generate the ramp signal VR that ramps within a reset voltage range during the reset time RT and ramps within a data voltage range during the data time DT.

The first anterior comparator AA11 may compare the first pixel signal VP11 with the ramp signal VR, and may generate the first anterior comparison signal VAOUT1 corresponding to the comparison result. For example, during the reset time RT and the data time DT, the first anterior comparator AA11 may generate the first anterior comparison signal VAOUT1 having a logic high level when a voltage level of the ramp signal VR is higher than a voltage level of the first pixel signal VP11. The first anterior comparator AA11 may generate the first anterior comparison signal VAOUT1 having a logic low level when the voltage level of the ramp signal VR is lower than the voltage level of the first pixel signal VP11. The first anterior comparison signal VAOUT1 may be sampled by the third sampling circuit CA1.3.

The first posterior comparator AA12 may compare the sampled first anterior comparison signal with the first reference signal VREF1 under the first comparison precondition. The first posterior comparator AA12 may generate the first posterior comparison signal VOUT11 corresponding to the comparison result. For example, during the reset time RT and the data time DT, the first posterior comparator AA12 may generate the first posterior comparison signal VOUT11 having a logic low level when a voltage level of the sampled anterior comparison signal is higher than the voltage level of the first reference signal VREF1. The first posterior comparator AA12 may generate the first posterior comparison signal VOUT11 having a logic high level when the voltage level of the sampled anterior comparison signal is lower than the voltage level of the first reference signal VREF1.

At this time, since the first posterior comparison signal VOUT11 is generated under the first comparison precondition, the transition time of the first posterior comparison signal VOUT11 and the transition time of the first anterior comparison signal VAOUT11 may be different from each other. For example, the transition time of the first posterior comparison signal VOUT11 may be less than the transition time of the first anterior comparison signal VAOUT1 by a set time. The set time may be determined according to a voltage difference ΔV, examples of which are described below with reference to FIGS. 14 and 15.

The global counter 150 may generate the count signals CNTs counted in a set manner during the row time SRT. For example, the global counter 150 may generate the count signals CNTs that are counted during the reset time RT and counted during the data time DT.

The first control circuit BA11 may generate the first storage control signal ASHOT1 based on the first posterior comparison signal VOUT11 and the input control signal S3. For example, the first control circuit BAH may allow the first storage control signal ASHOT1 to be generated for a set (e.g., relatively short) time according to the transition time of the first posterior comparison signal VOUT11 during the reset time RT and the data time DT. For example, the first control circuit BA11 may activate the first storage control signal ASHOT1 for the set (e.g., relatively short) time.

The first storage circuit BA21 may store the count signals CNTs based on the first storage control signal ASHOT1. For example, the first storage circuit BA21 may latch the count signals CNTs when the first storage control signal ASHOT1 pulses during the reset time RT, and may output the latched count signals (hereinafter referred to as "reset count signals") as the first digital signals D11s. In addition, the first storage circuit BA21 may latch the count signals CNTs when the first storage control signal ASHOT1 pulses during the data time DT, and may output the latched count signals (hereinafter referred to as "data count signals") as the first digital signals ails.

The reset count signals may further include a count code "a" corresponding to the set time, and the data count signals may further include a count code "a" corresponding to the set time. For example, the unnecessary count code "a" may be reflected in the reset count signals and the data count signals. In an embodiment, the count code "a" may be offset through a subsequent operation. For example, the subsequent operation may include a digital double sampling (DDS) operation.

The pixel array 120 may simultaneously generate the plurality of pixel signals VPs including the first pixel signal VP11 during the row time SRI. At this time, pixel signals having the same voltage level as the voltage level of the first pixel signal VP11 (hereinafter referred to as "same pixel signals") may present in the plurality of pixel signals VPs. In this case, the transition time of the first posterior comparison signal VOUT11 corresponding to the first pixel signal VP11 may be equal to the transition times of the posterior comparison signals corresponding to the same pixel signals. Descriptions thereof will be described in more detail with reference to FIGS. 14 and 15. Hereinafter, for convenience in description, the first pixel signal VP21 among the plurality of second pixel signals VP2s and the first pixel signal VP31 among the plurality of third pixel signals VP3s will be taken as an example of the same pixel signals and described.

FIG. 14 illustrates an embodiment of a timing diagram for operating the first pixel signals VP11, VP21 and VP31 according to an example.

Referring to FIG. 14, the first input terminals N11, N21 and N31 may be initialized to the first to third voltage levels, respectively, during the initialization time RST. For example, the first posterior comparator AA12 may initialize the first input terminal N11 to the first voltage level, which corresponds to the first summed current, based on the first control code signals CC1s during the initial period of the initialization time RST. The initial period corresponds to a period in which the first switch control signal S1 is activated. The first voltage level may be higher than the default voltage level by the voltage difference ΔV.

The first posterior comparator AB12 may initialize the first input terminal N21 to the second voltage level, which corresponds to the second summed current, based on the second control code signals CC2s during the initial period of the initialization time RST. The second voltage level may be equal to the default voltage level. The first posterior comparator AC12 may initialize the first input terminal N31 to the third voltage level, which corresponds to the third summed current, based on the third control code signals CC3s during the initial period of the initialization time RST. The third voltage level may be lower than the default voltage level by the voltage difference ΔV.

During the initialization time RST, the first to third reference signals VREF1, VREF2 and VREF3 having the default voltage level may be generated at the second input terminals N12, N22 and N32. The first to third reference signals VREF1, VREF2 and VREF3 may have the default voltage level adjusted during the last period of the initialization time RST. The last period corresponds to a period in which the first switch control signal S1 is deactivated and the second switch control signal S2 is activated.

In this state, during the row time SRT, the sampled first anterior comparison signal corresponding to the first pixel signal VP11 may be input through the first input terminal N11, the sampled first anterior comparison signal corresponding to the first pixel signal VP21 may be input through the first input terminal N21, and the sampled first anterior comparison signal corresponding to the first pixel signal VP31 may be input through the first input terminal N31. At this time, the voltage difference ΔV may be maintained among the sampled first anterior comparison signals input through the first input terminals N11, N21 and N31.

Accordingly, during the row time SRT, a delay difference corresponding to the voltage difference ΔV may occur among the first posterior comparison signals VOUT11, VOUT21 and VOUT31. For example, during the reset time RT of the row time SRT, crossing time points among the sampled first anterior comparison signals and the first to third reference signals VREF1, VREF2 and VREF3 are slightly changed. Thus, the first posterior comparison signals VOUT11, VOUT21 and VOUT31 may sequentially transition. In addition, during the data time DT of the row time SRT, the crossing time points among the sampled first anterior comparison signals and the first to third reference signals VREF1, VREF2 and VREF3 are slightly changed. Thus, the first posterior comparison signals VOUT11, VOUT21 and VOUT31 may sequentially transition.

According to the delay difference occurring among the first posterior comparison signals VOUT11, VOUT21 and VOUT31, the first control circuits BAH, BB11 and BC11 may sequentially activate the first storage control signals ASHOT1, BSHOT1 and CSHOT1, and the first storage circuits BA21, BB21 and BC21 may sequentially store the count signals CNTs based on the first storage control signals ASHOT1, BSHOT1 and CSHOT1, during the row time SRT. Accordingly, time points at which the first control circuits BA11, BB11 and BC11 and the first storage circuits BA21, BB21 and BC21 use the source power supply (e.g., power supply voltage VDD) may be dispersed. As a result, the amount of drops in the source power supply may be also dispersed.

FIG. 15 illustrates an embodiment of a timing diagram for operating the first pixel signals VP11, VP21 and VP31 according to another example.

Referring to FIG. 15, the first input terminals N11, N21 and N31 may be initialized to the default voltage level during the initialization time RST. For example, the first posterior comparator AA12 may initialize the first input terminal N11 to the default voltage level, which corresponds to the first current, during the initial period of the initialization time RST. The initial period corresponds to a period in which the first switch control signal S1 is activated. The first posterior comparator AB12 may initialize the first input terminal N21 to the default voltage level, which corresponds to the second current, during the initial period of the initialization time RST. The first posterior comparator AC12 may initialize the first input terminal N31 to the default voltage level, which corresponds to the third current, during the initial period of the initialization time RST.

During the initialization time RST, the first to third reference signals VREF1, VREF2 and VREF3 having the first to third voltage levels, respectively, may be generated at the second input terminals N12, N22 and N32. For example, the first posterior comparator AA12 may adjust the voltage level of the first reference signal VREF1 to the first voltage level, which corresponds to the first summed current, based on the first control code signals CC1s during the last period of the initialization time RST. The last period corresponds to a period in which the first switch control signal S1 is deactivated and the second switch control signal S2 is activated. The first voltage level may be higher than the default voltage level by the voltage difference ΔV.

The first posterior comparator AB12 may adjust the voltage level of the second reference signal VREF2 to the second voltage level, which corresponds to the second summed current, based on the second control code signals CC2s during the last period of the initialization time RST. The second voltage level may be equal to the default voltage level.

The first posterior comparator AC12 may initialize the voltage level of the third reference signal VREF3 to the third voltage level, which corresponds to the third summed current, based on the third control code signals CC3s during the last period of the initialization time RST. The third voltage level may be lower than the default voltage level by the voltage difference ΔV.

In this state, during the row time SRT, the sampled first anterior comparison signal corresponding to the first pixel signal VP11 may be input through the first input terminal N11, the sampled first anterior comparison signal corresponding to the first pixel signal VP21 may be input through the first input terminal N21, and the sampled first anterior comparison signal corresponding to the first pixel signal VP31 may be input through the first input terminal N31. At this time, the sampled first anterior comparison signals input through the first input terminals N11, N21 and N31 may have the same voltage level.

Accordingly, during the row time SRT, a delay difference corresponding to the voltage difference ΔV may occur among the first posterior comparison signals VOUT11, VOUT21 and VOUT31. For example, during the reset time RT of the row time SRT, crossing time points among the sampled first anterior comparison signals and the first to third reference signals VREF1, VREF2 and VREF3 are slightly changed. Thus, the first posterior comparison signals VOUT11, VOUT21 and VOUT31 may sequentially transition. In addition, during the data time DT of the row time SRT, the crossing time points among the sampled first anterior comparison signals and the first to third reference signals VREF1, VREF2 and VREF3 are slightly changed. Thus, the first posterior comparison signals VOUT11, VOUT21 and VOUT31 may sequentially transition.

According to the delay difference occurring among the first posterior comparison signals VOUT11, VOUT21 and VOUT31, the first control circuits BA11, BB11 and BC11 may sequentially activate the first storage control signals ASHOT1, BSHOT1 and CSHOT1, and the first storage circuits BA21, BB21 and BC21 may sequentially store the count signals CNTs based on the first storage control signals ASHOT1, BSHOT1 and CSHOT1, respectively, during the row time SRT. Accordingly, time points at which the first control circuits BA11, BB11 and BC11 and the first storage circuits BA21, BB21 and BC21 use the source power supply (e.g., power supply voltage VDD) may be dispersed. Thus, the amount of drops in the source power supply may be also dispersed.

In accordance with one or more of the aforementioned embodiments of the present disclosure, different comparison preconditions for each of a plurality of groups may be applied to pixel signals generated for each corresponding row, to thereby disperse the amount of drops in the source power supply. In accordance with these or other embodiments of the present disclosure, operational reliability of an image sensing device may be improved by reducing or minimizing the effect of the dropped power source.

While the present disclosure has been illustrated and described with respect to specific embodiment, the disclosed embodiments are provided for description, and not intended to be restrictive. Further, it is noted that the present disclosure may be achieved in various ways through substitution, change, and modification that fall within the scope of the following claims, as those skilled in the art will recognize in light of the present disclosure.

What is claimed is:

1. An image sensing device comprising:
   a first anterior comparator suitable for generating a first anterior comparison signal based on a first pixel signal and a ramp signal;
   a first posterior comparator suitable for performing a first comparison that compares the first anterior comparison signal with a first reference signal under a first comparison precondition and generating a first posterior comparison signal corresponding to a result of the first comparison;
   a second anterior comparator suitable for generating a second anterior comparison signal based on a second pixel signal and the ramp signal; and
   a second posterior comparator suitable for performing a second comparison that compares the second anterior comparison signal with a second reference signal under a second comparison precondition different from the first comparison precondition, and suitable for generating a second posterior comparison signal corresponding to a result of the second comparison,
   wherein the first posterior comparator includes:
   an input circuit suitable for receiving the first anterior comparison signal and the first reference signal;

a loading circuit coupled between the input circuit and a first voltage terminal;
a first current source coupled between the input circuit and a second voltage terminal and suitable for generating a first current corresponding to a voltage level of the first reference signal; and
a second current source coupled between the input circuit and the second voltage terminal and suitable for generating a first adjusting current for adjusting the voltage level of the first reference signal based on a first control code signal.

2. The image sensing device of claim 1, further comprising:
a first sampling circuit coupled to the first posterior comparator and suitable for sampling the first reference signal; and
a second sampling circuit coupled to the second posterior comparator and suitable for sampling the second reference signal.

3. The image sensing device of claim 1, wherein the first posterior comparator generates and adjusts the first reference signal through self-generation based on a first control code signal.

4. The image sensing device of claim 1, wherein the second posterior comparator generates and adjusts the second reference signal through self-generation based on a second control code signal.

5. The image sensing device of claim 1, wherein the second posterior comparator includes:
second input circuit suitable for receiving the second anterior comparison signal and the second reference signal;
a loading circuit coupled between the second input circuit and a third voltage terminal;
a first current source coupled between the second input circuit and a fourth voltage terminal, and suitable for generating a second current corresponding to a voltage level of the second reference signal; and
a second current source coupled between the second input circuit and the fourth voltage terminal, and suitable for generating a second adjusting current for adjusting the voltage level of the second reference signal based on a second control code signal.

6. The image sensing device of claim 1, wherein
the first comparison precondition includes a condition for initializing an input terminal, to which the first anterior comparison signal is input, to a first voltage level, and
the second comparison precondition includes a condition for initializing an input terminal, to which the second anterior comparison signal is input, to a second voltage level different from the first voltage level.

7. The image sensing device of claim 6, wherein
the first voltage level corresponds to a voltage level of the first reference signal adjusted during an initialization time, and
the second voltage level corresponds to a voltage level of the second reference signal adjusted during the initialization time.

8. The image sensing device of claim 1, wherein
the first comparison precondition includes a condition for adjusting a voltage level of the first reference signal to a first voltage level, and
the second comparison precondition includes a condition for adjusting a voltage level of the second reference signal to a second voltage level different from the first voltage level.

9. The image sensing device of claim 1, wherein the first and second anterior comparators operate under a same comparison precondition.

10. An image sensing device, comprising:
a first anterior comparator configured to be initialized during an initialization time and suitable for generating a first anterior comparison signal based on a first pixel signal and a ramp signal during a row time;
a first posterior comparator suitable for initializing a first input terminal to a first voltage level and a first sub-input terminal to a default voltage level during the initialization time, generating a first posterior comparison signal based on the first anterior comparison signal input through the first input terminal and a first reference signal input through the first sub-input terminal during the row time, and self-generating and adjusting the first reference signal based on a current generated in the first posterior comparator;
a second anterior comparator configured to be initialized during the initialization time and suitable for generating a second anterior comparison signal based on a second pixel signal and the ramp signal during the row time; and
a second posterior comparator suitable for initializing a second input terminal to a second voltage level different from the first voltage level and a second sub-input terminal to the default voltage level during the initialization time, generating a second posterior comparison signal based on the second anterior comparison signal input through the second input terminal and a second reference signal input through the second sub-input terminal during the row time, and self-generating and adjusting the second reference signal based on a current generated in the second posterior comparator,
wherein the first posterior comparator includes:
an input circuit suitable for receiving the first anterior comparison signal and the first reference signal;
a loading circuit coupled between the input circuit and a first voltage terminal;
a first current source coupled between the input circuit and a second voltage terminal, and suitable for generating a first current corresponding to a voltage level of the first reference signal; and
a second current source coupled between the input circuit and the second voltage terminal, and suitable for generating a first adjusting current for adjusting the voltage level of the first reference signal based on a first control code signal.

11. The image sensing device of claim 10, further comprising:
a first sampling circuit coupled to the first posterior comparator and suitable for sampling the first reference signal; and
a second sampling circuit coupled to the second posterior comparator, and suitable for sampling the second reference signal.

12. The image sensing device of claim 10, wherein the second posterior comparator includes:
second input circuit suitable for receiving the second anterior comparison signal and the second reference signal;
a loading circuit coupled between the second input circuit and a third voltage terminal;
a first current source coupled between the second input circuit and a fourth voltage terminal, and suitable for generating a second current corresponding to a voltage level of the second reference signal; and a second current source coupled between the second input circuit and the fourth voltage terminal, and suitable for generating a second adjusting current for adjusting the voltage level of the second reference signal based on a second control code signal.

13. An image sensing device, comprising:

a first anterior comparator to be initialized during an initialization time and suitable for generating a first anterior comparison signal based on a first pixel signal and a ramp signal during a row time;

a first posterior comparator suitable for adjusting a voltage level of a first reference signal to a first voltage level during the initialization time, generating a first posterior comparison signal based on the first anterior comparison signal and the first reference signal during the row time, and self-generating and adjusting the first reference signal based on a current generated in the first posterior comparator;

a second anterior comparator to be initialized during the initialization time, and suitable for generating a second anterior comparison signal based on a second pixel signal and the ramp signal during the row time; and a second posterior comparator suitable for adjusting a voltage level of a second reference signal to a second voltage level different to the first voltage level during the initialization time, generating a second posterior comparison signal based on the second anterior comparison signal and the second reference signal during the row time, and self-generating and adjusting the second reference signal based on a current generated in the second posterior comparator, wherein the first posterior comparator includes:

an input circuit suitable for receiving the first anterior comparison signal and the first reference signal;

a loading circuit coupled between the input circuit and a first voltage terminal;

a first current source coupled between the input circuit and a second voltage terminal, and suitable for generating a first current corresponding to a voltage level of the first reference signal; and a second current source coupled between the input circuit and the second voltage terminal, and suitable for generating a first adjusting current for adjusting the voltage level of the first reference signal based on a first control code signal.

14. The image sensing device of claim 13, further comprising:

a first sampling circuit coupled to the first posterior comparator and suitable for sampling the first reference signal; and a second sampling circuit coupled to the second posterior comparator, and suitable for sampling the second reference signal.

15. The image sensing device of claim 13, wherein the second posterior comparator includes:

second input circuit suitable for receiving the second anterior comparison signal and the second reference signal;

a loading circuit coupled between the second input circuit and a third voltage terminal;

a first current source coupled between the second input circuit and a fourth voltage terminal, and suitable for generating a second current corresponding to a voltage level of the second reference signal; and a second current source coupled between the second input circuit and the fourth voltage terminal and suitable for generating a second adjusting current for adjusting the voltage level of the second reference signal based on a second control code signal.

* * * * *